United States Patent
Ohara et al.

[11] Patent Number: 5,997,710
[45] Date of Patent: Dec. 7, 1999

[54] COPPER FOIL FOR A PRINTED CIRCUIT BOARD, A PROCESS AND AN APPARATUS FOR PRODUCING THE SAME

[75] Inventors: Muneharu Ohara, Hasuda; Yutaka Hirasawa, Okegawa; Tomohiro Miyazaki, Ageo, all of Japan

[73] Assignee: Mitsui Mining & Smelting Co., Ltd., Tokyo, Japan

[21] Appl. No.: 09/086,041

[22] Filed: May 28, 1998

Related U.S. Application Data

[62] Division of application No. 08/741,709, Oct. 31, 1996, Pat. No. 5,833,819.

[30] Foreign Application Priority Data

Dec. 6, 1995 [JP] Japan ................................. 7-344344

[51] Int. Cl.[6] ................................................. C25D 1/04
[52] U.S. Cl. ................................................. 205/77; 205/111
[58] Field of Search ........................................ 205/77, 111

[56] References Cited

U.S. PATENT DOCUMENTS

| | | | |
|---|---|---|---|
| 3,483,113 | 12/1969 | Carter | 204/28 |
| 3,901,785 | 8/1975 | Buzhinskaya et al. | 204/208 |
| 5,326,455 | 7/1994 | Kubo et al. | 205/77 |

Primary Examiner—Kishor Mayekar
Attorney, Agent, or Firm—Bucknam and Archer

[57] ABSTRACT

This invention provides a process for producing an electrolytic copper foil for a printed wiring board by supplying current between a rotary cathode and an electrolytic anode in a copper electrolyte so as to electrodeposit copper on the surface of the rotary cathode, wherein an anode for high electric current is placed opposite to the electrodeposition starting surface of the rotary cathode in such a manner that a part of the anode is projected above a liquid level of the copper electrolyte, and the copper electrolyte existing between the anode for high electric current and the opposed rotary cathode surface is electrolyzed by providing a high electric current with a current density higher than that of the electrolytic anode, and an apparatus for producing an electrolytic copper foil for a printed wiring board having excellent properties.

5 Claims, 6 Drawing Sheets

COPPER FOIL FOR A PRINTED CIRCUIT BOARD, A PROCESS AND AN APPARATUS FOR PRODUCING THE SAME

This is a divisional of application Ser. No. 08/741,709, filed Oct. 31, 1996, now U.S. Pat. No. 5,833,819.

FIELD OF THE INVENTION

This invention relates to a process for producing a copper foil for a printed wiring board, which copper foil is substantially free from curls and pinholes and is excellent in physical properties, and to an apparatus for producing such copper foil.

BACKGROUND OF THE PRIOR ART

There have heretofore been described processes for producing a pinhole-free electrolytic copper foil for printed wiring boards in Japanese Patent Application Publication Gazette No. Hei 3-1391 (or 1391/1991) and Japanese Patent Application Laid-Open Gazette No. Hei 1-198495 (or 198495/1989).

However, an electrolytic cell having an electrolyte containing a certain concentration of copper ions, a cathode surface which moves while immersing the surface thereof into said electrolyte, and an anode surface installed to a position opposite to said cathode surface has been used in the art of producing a copper foil according to Japanese Patent Application Publication Gazette No. Hei 3-1391 (or 1391/1991). In a first zone through which the cathode surface passes in the electrolytic cell, copper nucleuses are formed on the surface of the cathode by applying a pulsed first current density pulsating with values greater and smaller than that of a limiting current density of copper ion. Subsequently, in a second zone through which the cathode passes in the electrolytic cell, a relatively smooth deposit of the copper foil is formed on the surface of the cathode by applying a current density smaller than the density of the limiting current density. Further, in a third zone through which the cathode passes in the electrolytic cell, a plurality of nodules are formed on the deposit of the copper foil by applying a pulsed second high current density pulsating with values greater and smaller than that of the limiting current density. The prior art according to Japanese Patent Application Publication Gazette No. Hei 3-1391 (or 1391/1991) is intended to produce a surface treated copper foil by giving a surface treatment including the process steps as stated above.

More specifically, the art of producing a copper foil according to Japanese Patent Application Publication Gazette No. Hei 3-1391 (or 1391/1991) is intended to form a highly pore free ultra-thin copper foil having an adhesive nodularized outer surface. Since a layer having the nodules is formed on an electroplated metal, however, there is provided at least one zone having a current density greater than the limiting current density in an electrolytic cell. This current density zone is formed by a processing anode provided via a gap or an insulating material completely separated from a primary anode and is provided at the outlet or inlet and the outlet of an electrolytic cell.

In the art of producing a copper foil according to Japanese Patent Application Publication Gazette No. Hei 3-1391 (or 1391/1991), however, the copper foil has been so arranged that the first anode is placed in the electrolytic cell and is set lower than the liquid level therein but the process anode is not located in a position opposite to the electrodeposition starting zone of the cathode surface, that is, opposite to the cathode surface in the vicinity of a surface of an electrolyte. The current density is lower than that in the cathode surface situated opposite to the first anode and a sufficiently high current density is not obtainable there. Therefore, the copper foil obtained are such that a number of nucleuses are not formable initially and satisfactorily. As a result, the aforementioned art has not succeeded in solving problems to be solved by this invention intended to provide a copper foil substantially free from curls and pinholes.

The art disclosed in Japanese Patent Application Laid-Open Gazette No. Hei 1-198495 (or 198495/1989) is intended to carry out electrolysis with an electrolyte not containing gas at the initial and final stages of electrodeposition in order to obtain a pore-free copper foil by discharging the spent electrolyte containing a large quantity of gas generated by the electrolysis from a submerged liquid outlet provided in the upper portion of an electrolytic cell. Since the anode is placed under the liquid level even in this case, the art disclosed therein, like Japanese Patent Application Publication Gazette No. Hei 3-1391 (or 1391/1991), has not also succeeded in solving problems to be solved by this invention.

The copper foil produced by the aforementioned prior art methods has internal strain and pinholes to varying degrees and the aforementioned prior art aimed at solving these problems still fails to attain its object.

There has been a recent tendency to make a copper foil thinner for use in printed wiring boards and has been developed a demand for a copper foil free from internal distortion and pinholes. The internal distortion of a copper foil in particular develops as a curl phenomenon, which is recognized from the fact that the edges portion of a copper foil turns up when it is placed on a flat table, for example. The number of pinholes and curls of a copper foil for printed wiring boards tends to increase as its thickness is decreased and this has posed a serious problem as the demand for a thinner copper foil is increased.

When copper foil lamination is automatically conducted by means of robots, curls of the copper foil produced by the prior art methods tend to make the robot commit an error in handling the copper foil for printed wiring boards, that is, make the robot fail to take hold of it; the problem is that the production of printed wiring boards is not smoothly carried out. Therefore, a copper foil substantially free from curls has been desired.

SUMMARY OF THE INVENTION

An object of this invention is to provide a process for producing an electrolytic copper foil for a printed wiring board, which copper foil is excellent in physical properties, that is it is substantially free from curls and pinholes, and an apparatus for producing such copper foil.

The present inventors made intensive studies in attempts to solve the above problems concerning the prior art and, as the result of their studies, they found out that the foregoing problems are solved by setting an anode projected above the surface of an electrolyte flowing out by overflow, the anode being for use in making a high electric current flow toward the electrodeposition starting surface of a rotary cathode separated from an electrolytic anode, and thereby attaining a supplement of a high electric current onto the surface of the electrolyte, particularly in the vicinity of a vapor-liquid boundary. The present invention has thus been completed.

More specifically, this invention resides in a process for producing an electrolytic copper foil for a printed wiring board by supplying current between a rotary cathode and an electrolytic anode in a copper electrolyte so as to electrodeposit copper on the surface of the rotary cathode, wherein an anode for high electric current is placed opposite to the electrodeposition starting surface of the rotary cathode in such a manner that a part of the anode for high electric current is projected above the liquid level of the copper electrolyte, and the copper electrolyte present between the anode for high electric current and the opposite rotary cathode is electrolyzed by providing a high electric current zone through which a high electric current with a current density higher than that of the electrolytic anode is made to flow.

Another object of this invention resides in providing a copper foil substantially free from curls and pinholes, obtainable through the above process for producing the copper foil for a printed wiring board having excellent physical properties, and providing an apparatus for producing such copper foil.

Hereinbelow, this invention will be explained in more detail with reference to accompanying drawings.

FIG. 1 is a graph showing variations in current density from nucleation in the initial stage of electrodeposition up to crystal growth. In FIG. 1, curve (a) represents variation in current density in an ideal case; curve (b), measures values in the case of Example 3 of this invention; curve (c), measures values in reference to Comparative Example 1; and curve (d), measures values in reference to Comparative Example 2.

FIG. 2 is an enlarged fragmentary view showing the vicinity of an electrolyte inlet in the case of Comparative Example 2.

FIG. 3 is an enlarged fragmentary view showing the vicinity of an electrolyte inlet in the case of Example 2 of this invention.

FIG. 4 is a cross sectional view illustrating an apparatus for manufacturing a copper foil generally in use.

FIG. 5 is a cross sectional view illustrating an apparatus for manufacturing a copper foil according to this invention.

In FIGS. 2–5, reference numeral 1 denotes a rotary cathode; numeral 2 designates, an electrolytic anode installed opposite to the rotary cathode; numeral 3 designates, an anode for high electric current in which the anode has a hole allowing an electrolyte to pass through, the hole being formed with a net or a comb or in any other form; numeral 3' designates, a conventional plate-like anode for high electric current; numeral 4 designates, an insulating plate for insulating the anode 3 for high electric current from the electrolytic anode 2; numeral 5 designates, a take-up reel; and numeral 6 designates, a cell, respectively.

The process for producing a copper foil for a printed wiring board according to this invention has two features. As shown in FIGS. 3 and 5 one of the features is that the anode 3 for making a high electric current flow toward the electrodeposition starting side is configured like a net, a comb or the like instead of a plate which has conventionally been employed as shown in FIG. 2, so that an electrolyte is allowed to go in and out freely through the anode. The other feature of this invention is that a number of crystal nucleuses is formed on the electrodeposition starting surface by letting the high electric current flow between the anode for the high electric current and the cathode surface opposite to it, the high electric current having a current density higher than the current density between the electrolytic anode and the cathode surface opposite to it.

That is to say, according to the conventional electrolytic method, as shown in FIG. 2, the anode 3' for use in initial electrodeposition is completely submerged in the electrolyte and while the electrolyte is caused to pass over the anode, it is attempted to effect nucleation by means of the high electric current.

While trying to consider fault with the prior art, the present inventors have discovered the fact that nucleation is completed in an extremely short time in the initial stage of electrolysis. As is obvious from FIG. 1, the time required ranges from 0.1 to 1 sec (the time required for passage across the high electric current zone) and the present inventors have found the that the current density at the moment the electrodeposition starts is the most important factor.

In a case where a high electric current is made to flow through the submerged anode for initial electrodeposition, as shown in FIG. 2, according to the electrolytic method of the prior art, the current density at the moment the electrodeposition starts becomes lower than the average current density of said anode. Therefore, satisfactory nucleation cannot be accomplished, as shown by the curve (d) of FIG. 1. In the process according to this invention, on the other hand, the presence of the anode 3 placed opposite to the cathode surface of the electrodeposition starting zone as shown in FIGS. 3 and 5 allows to apply the sufficient current density at the moment the electrodeposition starts as it is obvious from the curve (b) of FIG. 1.

In addition to this, it is ideal if the current variation until an electrodeposition starting surface on a cathode arrives to the place opposite to the ordinary electrolytic anode 2 through the anode 3 for high electric current after the electrodeposition starting surface of the cathode runs into the electrolyte, follows the curve (a) of FIG. 1 and in the case of this invention, the current variation follows the curve (b) and this is proved to be substantially ideal in comparison with the curve (d) in the case of the prior art method.

The anode 3 for high electric current used in the process of producing a copper foil for a printed wiring board according to this invention can be installed by suspending said anode 3 like a net such as a lath DSE made by Permeleck Co., for example, at the inlet of the ordinary electrolytic anode 2 or otherwise setting it on the stage of the insulating plate 4. As far as the electrolyte is allowed to readily pass through the anode 3 for high electric current, it is not restricted to said anode 3 like the net but may be prepared by boring a plurality of holes of suitable dimensions in a comb or plate-like anode, for example. The anode 3 for high electric current like this is preferably such that an electrolyte containing bubbles is allowed to readily pass through it in order to remove a large amount of gas generated in the vicinity of the anode due to electrolysis.

When the anode 3 for high electric current is installed, the following precaution ought to be taken, that is, the anode 3 has been immersed and simultaneously a part of the anode remains to project from the surface of the electrolyte. If the anode 3 is arranged so that it is vertically movable by making free use of various mechanisms and technology known in the art, fluctuations in the liquid level of the electrolyte can simply be dealt with even in a case where the quantity of electrolyte supplied is varied.

What is the most important in the process of this invention is that a high electric current is supplied to the rotary cathode 1 from the anode 3 for high electric current so as to make a sufficient current density for 0 to 1 sec. until nucleation is completed immediately after electrodeposition is started. The current ranges from 1.0 to 3.0 A/cm$^2$ and preferably 1.5 to 2.5 A/cm$^2$. In this case, nucleation will not be carried out satisfactorily at less than 1.0 A/cm$^2$, whereas a level in excess of 3.0 cm$^2$ is undesirable because the deterioration of the anode occurs. And also, since a high current density is applied to the rotary cathode 1, nucleation is completed in a shorter time than preferable time and crystal growth is started while the high current density is maintained. As a result of this, granular copper deposition called burned plating is brought about, which badly affects the physical properties of the copper foil obtained (see burned plating area of FIG. 1).

In FIG. 1, the curve (a) represents the most ideal nucleation curve. The highest current density is applied immediately after electrodeposition is started and the current density lowers as nucleation proceeds. When the nucleation is completed, the curve (a) converges to the ordinary electrolytic current density without entering the burned plating area.

In FIG. 1, the curve (b) represents variations in the current density according to Example 2 of this invention and a curve of current density variations close to an ideal one.

In FIG. 1, the curve (d) represents variations in the current density in the case of Comparative Example 2 which follows the conventional method, depicting insufficient current at the time of nucleation. The curve (d) shows the current density from the final stage of nucleation through the initial stage of crystal growth which has entered the burned plating area. In this case, the current density in the initial stage of crystal growth is to intrude deeply into the burned plating area, thus effecting a bad influence on the physical properties of the copper foil obtained.

In the process of producing a copper foil for a printed wiring board according to this invention, the copper foil for a printed wiring board is substantially free from curls and pinholes with a tensile strength of not less than 44.8 kg/mm$^2$ and an elongation of not less than 8.5% in a normal temperature, and an elevated temperature (measured value in a temperature of 180° C.) tensile strength of not less than 20.9 kg/mm$^2$, an elongation of not less than 5.1% and a surface roughness Rmax of not greater than 3 μm on the deposited side (matte side).

In the process of producing a copper foil according to this invention, it is possible to obtain the copper foil which is substantially free from curls and pinholes and has excellent physical properties by letting a current having a high current density flow on a cathode at the moment an electrodeposition starting surface enters the electrolyte to cause a number of high-density crystal nucleuses to be formed.

Moreover, an apparatus for producing an electrolytic copper foil for a printed wiring board according to this invention, comprising a rotary cathode 1 and an electrolytic anode 2 installed opposite to the rotary cathode 1, wherein the copper foil for a printed wiring board is manufactured by electrolyzing a copper electrolyte supplied between the rotary cathode 1 and the electrolytic anode 2, and an anode 3 for letting flow a high electric current having a current density higher than that of the electrolytic anode 2 toward the electrodeposition starting surface of the cathode 1, provided on the electrolytic anode 2 via an insulating plate 4 in such a manner that a part of the anode is projected above the liquid level of the copper electrolyte.

Since the anode 3 for high electric current is provided on the electrolytic anode 2 via the insulating plate 4 in such a manner that a part of the anode 3 is projected above the liquid level of the copper electrolyte, electrolytic copper foil having excellent physical properties can be manufactured by setting the anode projected above the surface of the electrolyte flowing out by overflow so as to supply a high electric current to the electrodeposition starting surface of the cathode, that is, to the cathode in the vicinity of a vapor-liquid boundary.

Effect of the Invention

The process of producing a copper foil for a printed wiring board according to this invention is designed to make the copper foil free from curls and pinholes with simple electrolytic facilities and allows the facilities to be controlled freely. Therefore, the copper foil obtained thereby has not only excellent physical properties (high tensile strength, low roughness) but also elevated temperature-physical properties capable of satisfactorily preveating foil cracks which have posed a serious problem in multilayered printed wiring boards used mainly in recent years.

Figure 1:
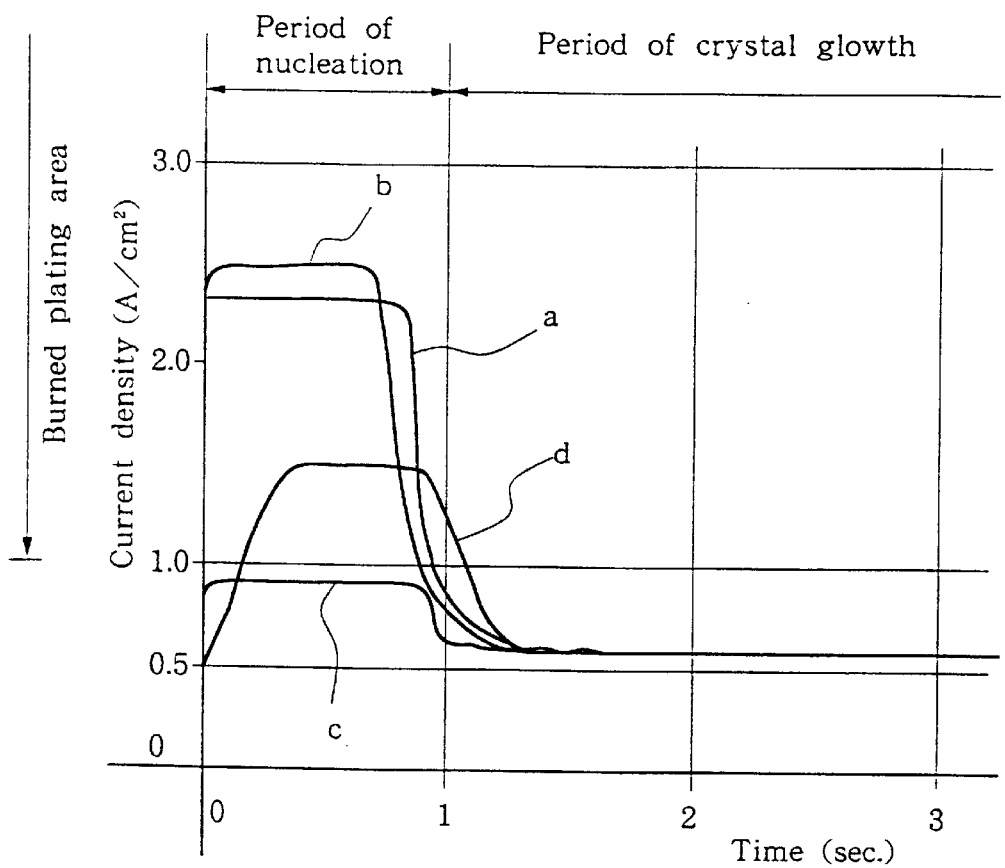
FIG. 1 is a graph showing variations in current density from nucleation at the initial stage of electrodeposition up to crystal growth.
Figure 2:
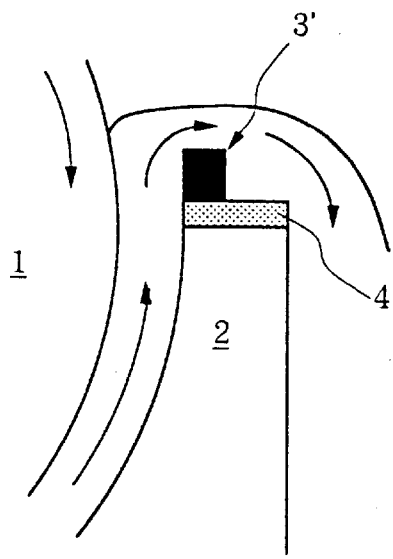
FIG. 2 is an enlarged fragmentary view showing the vicinity of an electrolyte inlet of Comparative Example 2.

In the drawings, numeral 1 indicates a rotary cathode, numeral 2 an electrolytic anode, numeral 3 an anode for high electric current, numeral 3' a conventional plate-like anode for high electric current, numeral 4 an insulating plate, numeral 5 a take-up reel and numeral 6 a cell, respectively.

DESCRIPTION OF THE PREFERRED EMBODIMENTS

The invention will now be described concretely with reference to the following Examples and Comparative Examples. Examples 1 through 3 and Comparative Examples 1 through 3 are concerned with specifying an optimum range of current densities with respect to anodes for high electric current, whereas Examples 4 through 6 and Comparative Examples 4 through 6 are concerned with specifying applied time of an anode for high electric current.

EXAMPLE 1

Figure 3:
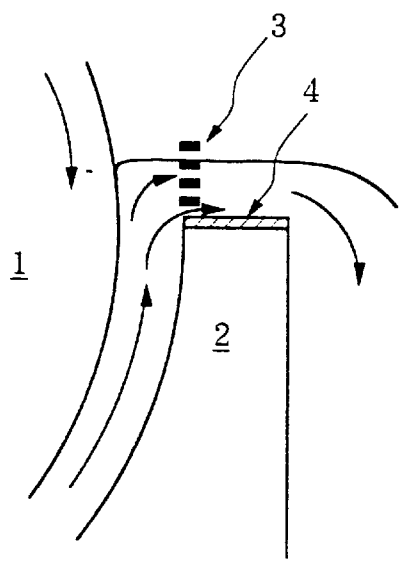
FIG. 3 is an enlarged fragmentary view showing the vicinity of an electrolyte inlet of Example 3 of this invention.
Figure 4:
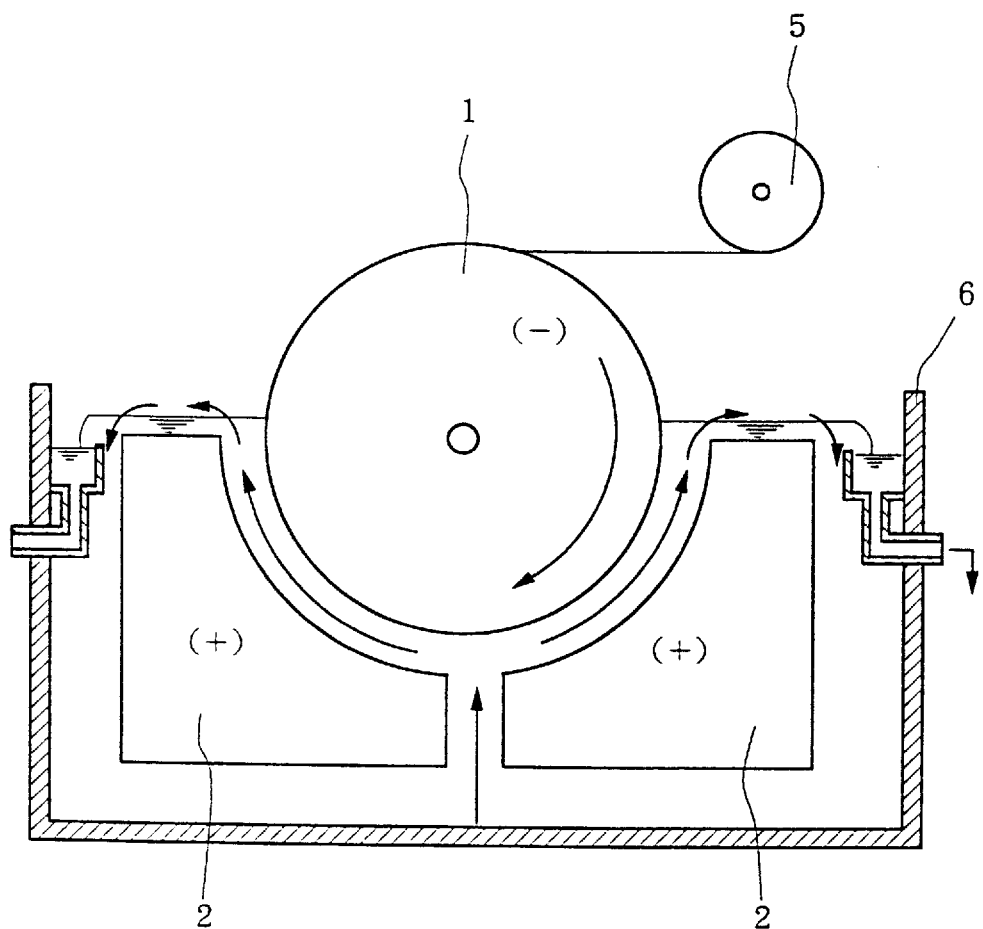
FIG. 4 is a cross sectional view illustrating an apparatus for producing an electrolytic copper foil generally in use.
Figure 5:
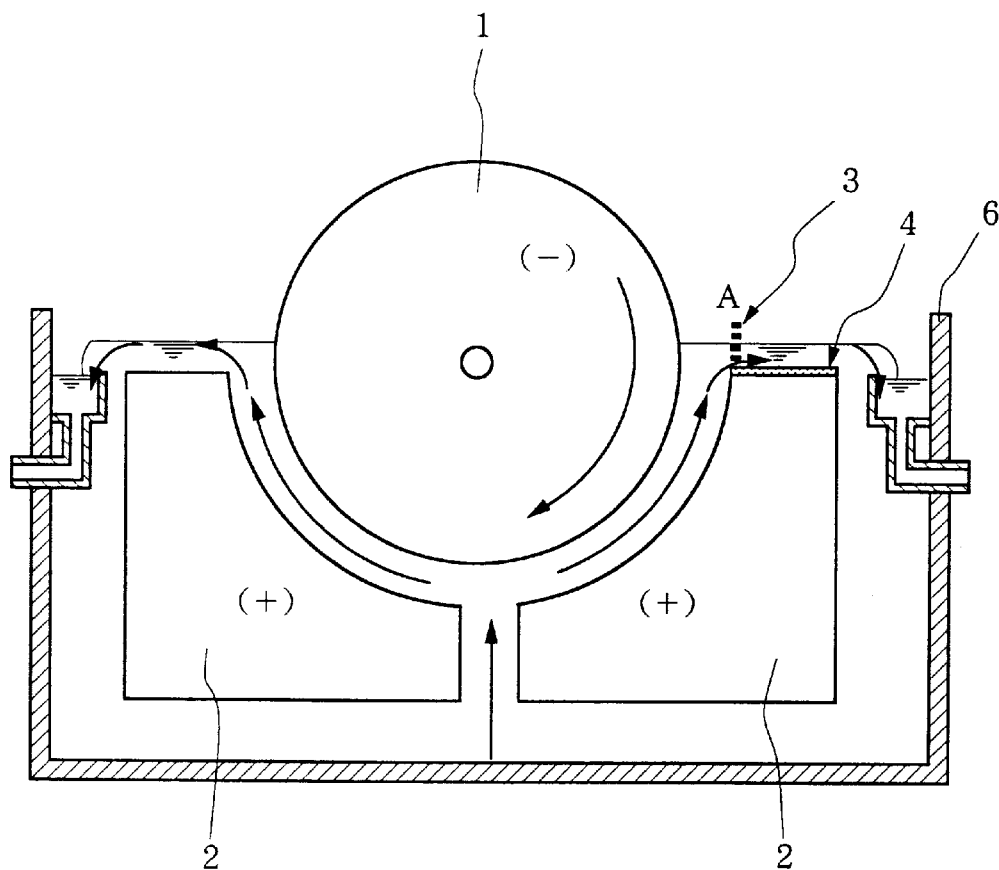
FIG. 5 is a cross sectional view illustrating an apparatus for producing an electrolytic copper foil according to this invention.

In an apparatus for continuously producing a copper foil by letting pass an electrolyte containing copper ions between a cylindrical cathode 1 which was kept rotating and an electrolytic anode 2 positioned opposite to the cylindrical cathode 1 as shown in FIG. 4, a net-like anode 3 for high electric current was installed via an insulating plate 4 on the electrolytic anode 2 in such a manner that the anode 3 for high electric current projected above the surface of the overflowing electrolyte in an inlet (electrolysis starting) portion where the electrodeposition starting surface of a cathode runs into in the electrolyte as shown in FIG. 3 (a height of the insulating plate: 2 mm, a height of the anode: 50 mm, and a depth of immersing liquid: 10 mm). While a current of 1.1 A/cm$^2$ was kept flowing through the anode 3, electrodeposition was carried out under the following conditions to prepare copper foils 18 μm and 12 μm thick.

Copper ion concentration: 80 g/l,

Sulfuric acid concentration: 110 g/l,

Chloride ion concentration: 20 mg/l,

Liquid temperature: 50° C.,

Current density of electrolytic anode 2: 0.6 A/cm$^2$,

Gelatin concentration: 3 ppm, and applied time of the anode 3 for high electric current: 0.5 sec.

EXAMPLE 2

Electrodeposition was carried out under the same conditions as those in Example 1 except that the current density of the anode 3 for high electric current was set at 1.5 A/cm$^2$ to prepare copper foils 18 μm and 12 μm thick.

EXAMPLE 3

Electrodeposition was carried out under the same conditions as those in Example 1 except that the current density of the anode 3 for high electric current was set at 2.5 A/cm$^2$ to prepare copper foils 18 μm and 12 μm thick.

Comparative Example 1

Electrodeposition was carried out under the same conditions as those in Example 1 except that the current density of the anode 3 for high electric current was set at 0.9 A/cm$^2$ to prepare copper foils 18 μm and 12 μm thick.

The copper foil thus obtained exhibited no pinholes but a few curls.

Comparative Example 2

In the apparatus for continuously producing a copper foil by letting pass an electrolyte containing copper ions between the rotating cylindrical cathode 1 and the electrolytic anode 2 positioned opposite to the cylindrical cathode 1 as shown in FIG. 4, a plate-like anode 3' (overflow type anode for high electric current) was installed at an inlet (electrolysis starting) portion (height of the insulating plate: 2 mm, height of the anode: 10 mm). While a current of 1.5 A/cm$^2$ was kept flowing through the anode 3', electrodeposition was carried out under the same conditions as those in Example 2 except that the anode 3 for high electric current in Example 2 was replaced with the anode 3' to prepare copper foils 18 μm and 12 μm thick.

The copper foils thus obtained exhibited both pinholes and curls.

Comparative Example 3

In the apparatus for continuously producing a copper foil by letting pass an electrolyte containing copper ions between the rotating cylindrical cathode 1 and the anode positioned opposite to the cylindrical cathode 1 as shown in FIG. 4, electrolysis was carried out under the same conditions as those in Example 1 except that said anode 3 for high electric current was not provided to prepare copper foils 18 μm and 12 μm thick.

EXAMPLE 4

Electrodeposition was carried out under the same conditions as those in Example 2 except that the applied time for electrolysis at the anode 3 for high electric current was 0.1 sec to prepare copper foils 18 μm and 12 μm thick.

EXAMPLE 5

Electrodeposition was carried out under the same conditions as those in Example 4 except that the applied time for electrolysis at the anode 3 for high electric current was 0.5 sec to prepare copper foils 18 μm and 12 μm thick. Although this example was carried out under entirely the same conditions as those in Example 2, it was listed as Example 5 for convenience of description.

EXAMPLE 6

Electrodeposition was carried out under the same conditions as those in Example 4 except that the applied time for electrolysis at the anode 3 for high electric current was 1.0 sec to prepare copper foils 18 μm and 12 μm thick.

Comparative Example 4

Electrodeposition was carried out under the same conditions as those in Comparative Example 3 to prepare copper foils 18 μm and 12 μm thick. Although this Comparative Example was carried out under entirely the same conditions as those in Comparative Example 3, it was listed as Comparative Example 4 for convenience of description.

The copper foils thus obtained exhibited both pinholes and curls.

Comparative Example 5

Electrodeposition was carried out under the same conditions as those in Example 4 except that the applied time for electrolysis at the anode 3 for high electric current was 0.05 sec to prepare copper foils 18 μm and 12 μm thick.

The copper foils thus obtained exhibited both pinholes and curls.

Comparative Example 6

Electrodeposition was carried out under the same conditions as those in Example 4 except that the applied time for electrolysis at the anode 3 for high electric current was 2.0 sec to prepare copper foils 18 μm and 12 μm thick.

The copper foil thus obtained exhibited fragility and lowered utility together with many pinholes though 0 mm curling.

TEST EXAMPLE 1

The copper foils prepared according to Examples 1–6 and Comparative Examples 1–6 were subjected to pinhole test by Pinhole Evaluation Dye Penetration Method defined in the IPC-TM-650 to examine the number of pinholes per m$^2$.

Further, the copper foil prepared according to Examples 1–6 and Comparative Examples 1–6 was cut into pieces of 10 cm-square as samples and these samples were placed on a flat table with the cathode side (shiny side) downward to measure the raised height (curling) at four corners of each piece. The internal distortion of each sample was expressed by the mean value of curls of the four corners. The thus obtained test results are shown in Tables 1 and 3.

TABLE 1

| | 18 μm-thickness | | 12 μm-thickness | |
|---|---|---|---|---|
| Test No. | curl (mm) | pinhole (the number) | curl (mm) | pinhole (the number) |
| Example 1 | 0 | 0 | 0 | 0 |
| Example 2 | 0 | 0 | 0 | 0 |
| Example 3 | 0 | 0 | 0 | 0 |
| Comp. Ex. 1 | 3 | 0 | 5 | 0 |
| Comp. Ex. 2 | 10 | 38 | 23 | 61 |
| Comp. Ex. 3 | 18 | 55 | 30 | 110 |

TABLE 3

| | 18 μm-thickness | | 12 μm-thickness | |
|---|---|---|---|---|
| Test No. | curl (height) | pinhole (the number) | curl (mm) | pinhole (the number) |
| Example 4 | 0 | 0 | 0 | 0 |
| Example 5 | 0 | 0 | 0 | 0 |
| Example 6 | 0 | 0 | 0 | 0 |
| Comp. Ex. 4 | 18 | 55 | 30 | 110 |
| Comp. Ex. 5 | 2 | 2 | 3 | 5 |
| Comp. Ex. 6 | 0 | 320 | 0 | 870 |

TEST EXAMPLE 2

The roughness (Ra, Rz and Rmax) of the deposited side, tensile strength and elongation of the copper foil prepared according to Examples 1–6 and Comparative Examples 1–6 were measured at room temperature and elevated temperature (measured values in atmosphere of 180° C.). The thus obtained results were shown in Tables 2 and 4.

TABLE 2

(18 μm thickness)

| Test No. | Roughness of the deposited side (μm) | | | Tensile strength (Kg/mm$^2$) | | Elongation (%) | |
|---|---|---|---|---|---|---|---|
| | Ra | Rmax | Rz | room temp. | elevated temp. | room temp. | elevated temp. |
| Example 1 | 0.41 | 3.3 | 2.8 | 44.8 | 20.9 | 8.5 | 5.1 |
| Example 2 | 0.36 | 3.1 | 2.5 | 46.3 | 22.2 | 10.1 | 5.5 |
| Example 3 | 0.36 | 2.8 | 2.3 | 45.0 | 22.0 | 9.4 | 5.2 |
| Comp. Ex. 1 | 0.50 | 4.3 | 3.2 | 39.8 | 18.2 | 7.2 | 4.0 |
| Comp. Ex. 2 | 0.54 | 4.8 | 3.6 | 36.7 | 17.0 | 7.2 | 2.2 |
| Comp. Ex. 3 | 0.74 | 6.2 | 5.3 | 34.5 | 16.3 | 5.9 | 1.8 |

TABLE 4

(18 μm thickness)

| Test No. | Roughness of the deposited side (μm) | | | Tensile strength (Kg/mm$^2$) | | Elongation (%) | |
|---|---|---|---|---|---|---|---|
| | Ra | Rmax | Rz | room temp. | elevated temp. | room temp. | elevated temp. |
| Example 4 | 0.39 | 3.2 | 2.7 | 45.9 | 21.2 | 9.3 | 5.1 |
| Example 5 | 0.36 | 3.1 | 2.5 | 46.3 | 22.2 | 10.1 | 5.5 |
| Example 6 | 0.38 | 3.2 | 2.6 | 46.0 | 22.3 | 10.0 | 5.6 |
| Comp. Ex. 4 | 0.74 | 6.2 | 5.3 | 34.5 | 16.3 | 5.9 | 1.8 |
| Comp. Ex. 5 | 0.51 | 4.2 | 3.2 | 41.6 | 19.7 | 8.0 | 4.6 |
| Comp. Ex. 6 | 1.07 | 8.2 | 6.7 | 24.1 | 8.9 | 0.8 | 0.5 |

As set forth above, the influence of the initial electrodeposition in the process of the electrolytic copper foil may be summarized as shown in Table 5.

Figure 6:
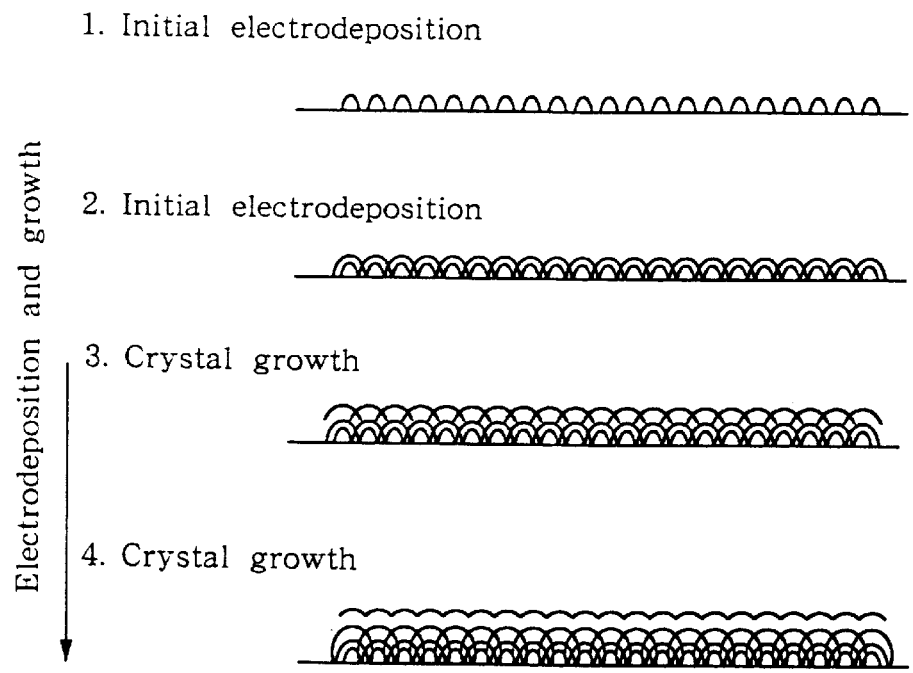
FIG. 6 is a model diagram of crystal growth when nucleation is densely carried out.

In the electrolysis process according to this invention, the nucleation is densely carried out initially. As a result, the copper foil thus obtained is substantially free from curls and micropore, and also the smoothness of deposited side (matte side) is improved. FIG. 6 is a model diagram of crystal growth when the nucleation is densely carried out.

Figure 7:
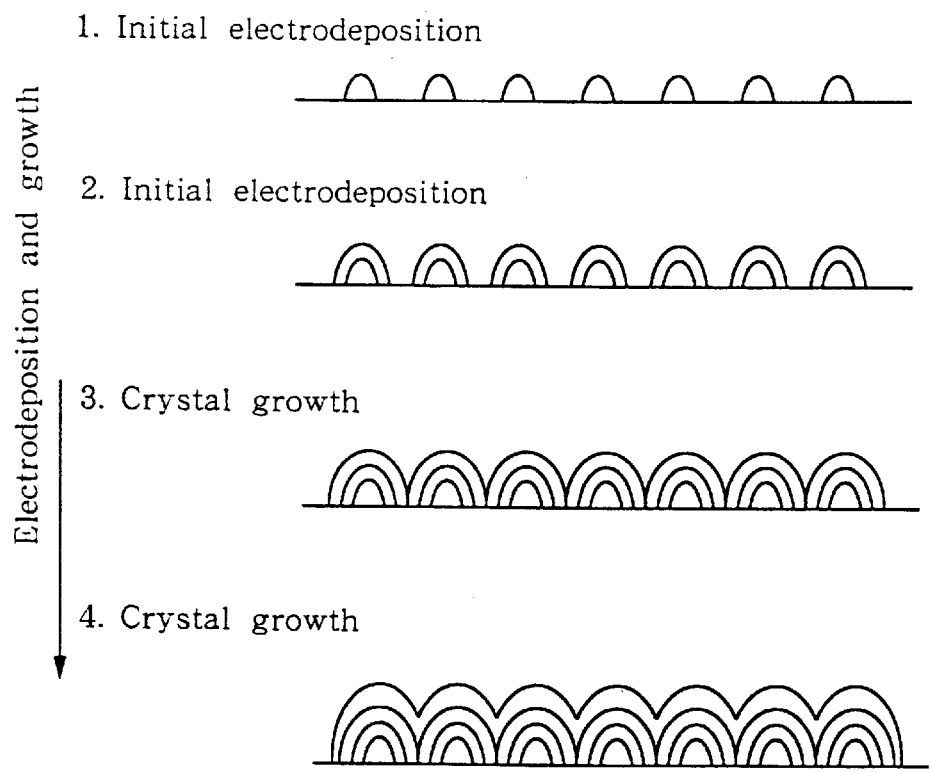
FIG. 7 is a model diagram of crystal growth when nucleation is coarsely carried out.

When electrodeposition is conducted under the prior art methods, nucleation is coarsely carried out. The copper foil thus obtained have considerable curls and micropore, thus making the roughness of a matte side greater. FIG. 7 is a model diagram of crystal growth when the nucleation is coarsely carried out.

TABLE 5

Relationship between Crystal Growth State Resulting from Inital Electrodeposition and Curl/Pinhole

| Initial electro-deposition state | State of crystal growth obtainable under the initial electrodeposition state | Physical properties obtained | | |
|---|---|---|---|---|
| | | Curl | Pinhole | Roughness on matte side |
| Many nucleuses are densely formed | Growth with deposited side kept smoothess as many nucleuses are formed to generate a dense initial electrodeposited layer and further uniform electro-deposition is conducted. | Small | Few | Low |
| A few nucleuses are coarsely formed | Growth having coarse large crystals and expanding radially, vertically and hori-zontally, centering on initially electrodeposited rough nucleuses. | Large | Many | High |

What is claimed is:

1. A process of producing an electrolytic copper foil for a printed wiring board comprising the steps of:

(a) supplying electric current between a rotary cathode (1) and each of an electrolytic anode (2) and an anode for high electric current (3) in a copper electrolyte, to electrodeposit copper on a surface of said rotary cathode; said copper electrolyte having a level; said rotary cathode having an electrodeposition starting surface; said anode for high electric current having a hole or being shaped as a net or comb to allow the copper electrolyte to go through in and out freely and being placed opposite to said electrodeposition starting surface of said rotary cathode in such a manner that a part of the anode (3) for high electric current is projected above said liquid level of the copper electrolyte;

and the electric curent provided in a high electric current zone, which lies between said electrodeposition-starting surface of the rotary cathode and the anode for high electric current (3) has a higher current density than the electric current provided between said rotary cathode and the electrolytic anode (2) and (b) peeling an electrolytic copper foil thus electrodeposited off the surface of said rotary cathode.

2. The process according to claim 1, wherein the higher current density of the electric current provided in said high electric current zone ranges from 1.0 to 3.0 A/cm$^2$.

3. The process according to claim 1, wherein the period of time wherein a point on the surface of said rotary cathode passes through said high electric current zone ranges from 0.1 to 1 second per rotation of said rotary cathode.

4. The process according to claim 1, wherein said electrolytic copper foil produced in step b) is substantially free from curls and pinholes and has a tensile strength of not less than 44.8 kg/mm$^2$ and an elongation of not less than 8.5% at normal temperature.

5. The process according to claim 1, wherein said anode (3) is insulated from said anode (2) by means of an insulating plate.

* * * * *